United States Patent
Edwards et al.

(10) Patent No.: US 8,582,297 B2
(45) Date of Patent: Nov. 12, 2013

(54) CUSTOMIZED THERMAL INTERFACE TO OPTIMIZE MECHANICAL LOADING AND THERMAL CONDUCTIVITY CHARACTERISTICS

(75) Inventors: David L. Edwards, Poughkeepsie, NY (US); Randall G. Kemink, Poughkeepsie, NY (US); David C. Olson, Lagrangeville, NY (US); Katie L. Pizzolato, Austin, TX (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 13/020,102

(22) Filed: Feb. 3, 2011

(65) Prior Publication Data

US 2012/0199333 A1  Aug. 9, 2012

(51) Int. Cl.
  *H05K 7/20* (2006.01)
(52) U.S. Cl.
  USPC ............ 361/708; 361/705; 361/710; 438/122
(58) Field of Classification Search
  USPC .................................. 361/688–689, 700–720
  See application file for complete search history.

(56) References Cited

U.S. PATENT DOCUMENTS

| | | | | |
|---|---|---|---|---|
| 5,221,575 A | * | 6/1993 | Nakano et al. | 428/323 |
| 6,037,659 A | | 3/2000 | Weixel | 257/717 |
| 6,255,139 B1 | * | 7/2001 | Edwards et al. | 438/122 |
| 6,432,497 B2 | * | 8/2002 | Bunyan | 428/40.1 |
| 6,773,963 B2 | | 8/2004 | Houle | 438/122 |
| 6,891,259 B2 | * | 5/2005 | Im et al. | 257/687 |
| 7,223,638 B2 | | 5/2007 | Starkston | 438/122 |
| 8,081,468 B2 | * | 12/2011 | Hill et al. | 361/710 |
| 2005/0027055 A1 | | 2/2005 | Dani et al. | 524/439 |
| 2005/0041406 A1 | * | 2/2005 | Matayabas et al. | 361/784 |
| 2005/0068739 A1 | * | 3/2005 | Arvelo et al. | 361/718 |
| 2006/0124700 A1 | | 6/2006 | Houle et al. | 228/101 |
| 2006/0234056 A1 | * | 10/2006 | Huang et al. | 428/408 |
| 2008/0230894 A1 | | 9/2008 | Heydari et al. | 257/714 |
| 2009/0093072 A1 | | 4/2009 | Hua et al. | 438/15 |
| 2009/0146294 A1 | | 6/2009 | Hillman et al. | 257/714 |
| 2009/0212418 A1 | | 8/2009 | Gurrum et al. | 257/717 |

OTHER PUBLICATIONS

Bachmann et al., "Hotspot remediation with anisotropic thermal interface materials", Thermal and Thermomechanical Phenomena in Electronic Systems, 2008. ITHERM 2008. 11th Intersociety Conference on, May 28-31, 2008 pp. 238-247.

* cited by examiner

*Primary Examiner* — Courtney Smith
(74) *Attorney, Agent, or Firm* — Dennis Jung; Ido Tuchman

(57) ABSTRACT

A method, system, and apparatus for cooling one or more devices through use of a cooling plate. An example system includes multiple heat generating devices coupled to a cooling plate, each through an individual thermal interface unit. The thermal interface unit includes a compressible solid pad with at least one surface having a plurality of projections carrying a flowable material. The thermal interface units are pressed between the heat generating devices and the cooling plate so that the flowable material is completely enclosed.

20 Claims, 10 Drawing Sheets

CUSTOMIZED THERMAL INTERFACE TO OPTIMIZE MECHANICAL LOADING AND THERMAL CONDUCTIVITY CHARACTERISTICS

BACKGROUND OF THE INVENTION

The present invention relates to thermal interface materials for cooling systems used on multiple integrated chip devices assembled on a common printed circuit board, and methods for forming the same.

Electronic packaging designs continue to trend toward increased density. A by-product of this trend is the application of multiple integrated chip devices assembled to a common printed circuit board. Due to the increasing package density, more and more devices require active thermal cooling. Multiple devices with different mechanical sensitivities, heights, and thermal power dissipation characteristics mounted on the same printed circuit board may need cooling simultaneously.

If a single cooling device, such as a cooling plate, is used to cool multiple devices, thick gaps of variable size may exist between the devices and the cooling plate. Thermal interface materials may be used to couple the devices with the cooling plate. During assembly, thermal interface materials thick enough to fill the gaps, such as thermal gap pads, may exert mechanical stress on the devices capable of creating short-term and/or long-term damage. Less rigid thermal interface materials, such as thermal gels, may dissociate from the device during expansion and contraction associated with the device's thermal and/or power-on/off cycles.

BRIEF SUMMARY OF THE INVENTION

An example embodiment of the present invention is an apparatus for cooling a device with a gap between the device and a cooling plate. The apparatus includes a thermal interface including a compressible solid pad. The solid pad includes a top surface and a bottom surface. The top surface includes a top surface treatment carrying a flowable material. The thermal interface is pressed between the device and the cooling plate.

Yet another example embodiment of the invention is a cooling system that includes a plurality of heat generating components, a cooling plate, and a plurality of thermal interface units. The thermal interface units are each pressed between a corresponding heat generating component and the cooling plate. Each of the thermal interface units includes a compressible solid pad with a top surface and a bottom surface. The top surface includes a top surface treatment carrying a flowable material.

Yet a further example embodiment of the invention is a method for coupling a plurality of heat generating components with a cooling plate. The method includes placing a thermal interface unit between each of the heat generating components and the cooling plate. The thermal interface unit includes a compressible solid pad. The solid pad includes at least one surface having surface treatment that carries a flowable material. The method also includes pressing the thermal interface units between the heat generating components and the cooling plate.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The present invention is described with reference to embodiments of the invention. Throughout the description of the invention reference is made to FIGS. 1-10.

As discussed in detail below, embodiments of the present invention include a thermal interface designed to prevent mechanical pumping (dissociation) effects associated with thermal gels and to minimize mechanical loading effects on heat generating devices that occur while pressing the thermal interface into place.

Figure 1:
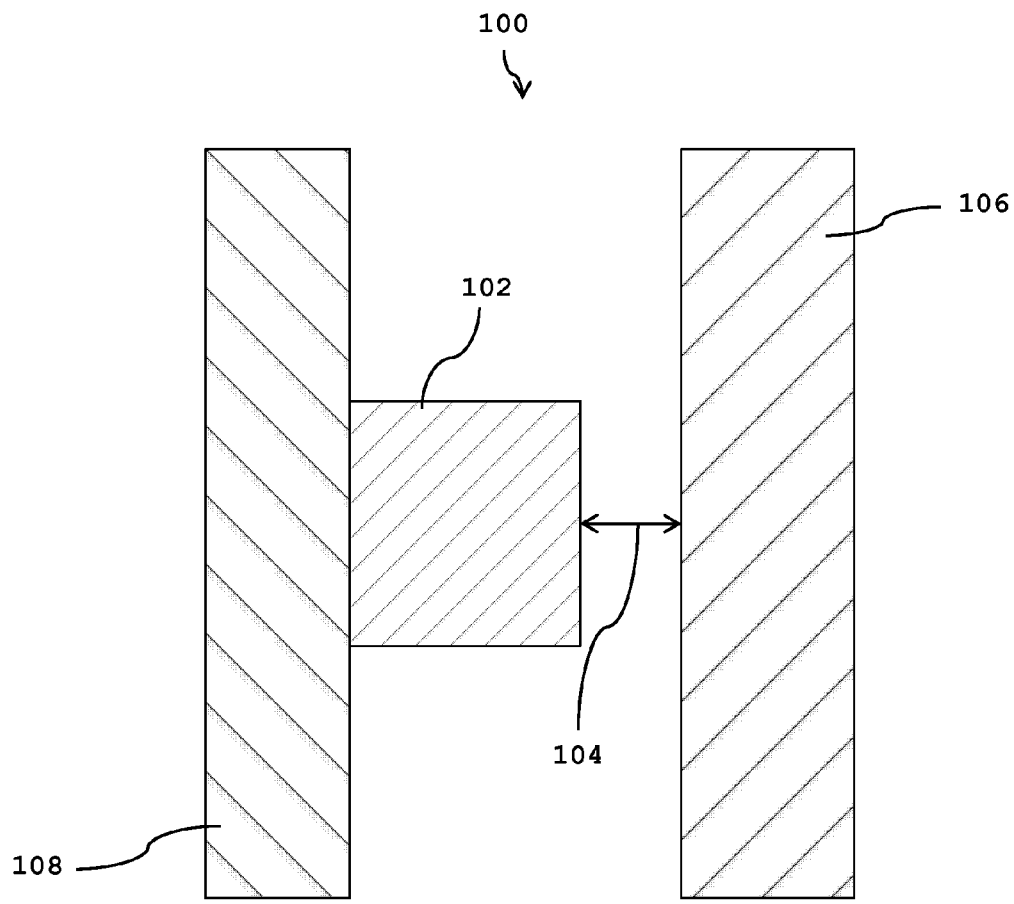
FIG. 1 shows a cross-sectional view of an example system contemplated by the present invention without the thermal interface.

FIG. 1 shows a cross-sectional view of an example system 100 contemplated by the present invention. The system 100 includes a device 102 with a gap 104 between the device 102 and a cooling plate 106. In this example system, the device 102 generates heat and is attached to a mounting 108. The gap 104, also known as a thick gap, generally spans at least 0.25 mm, but the size may range to 5.0 mm and even include thin gaps (less than 0.25 mm) depending on the embodiment. The system 100 shown is just one example of various arrangements of the present invention and should not be interpreted as limiting the invention to any particular configuration.

Figure 2:
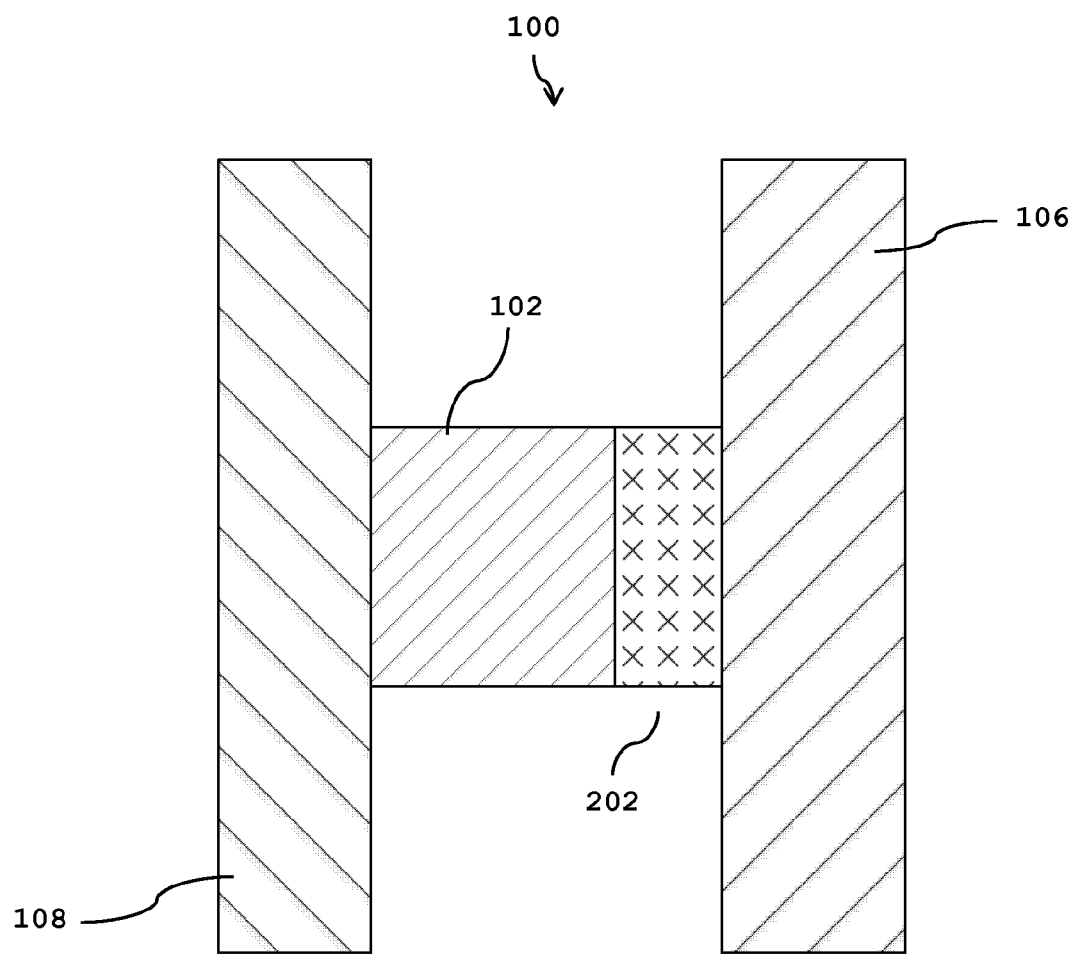
FIG. 2 shows a cross-sectional view of an example system incorporating the thermal interface.

FIG. 2 shows the system 100 with a thermal interface 202 placed in the gap 104 and pressed between the device 102 and the cooling plate 106. The thermal interface 202 conducts heat from the device 102 to the cooling plate 106, thereby cooling the device 102. Furthermore, the cooling plate 106 may transfer heat out of the system 100.

In various embodiments, the device 102, mounting 108, cooling plate 106 and gap 104 may take different forms. The cooling plate 106, for example, may be a liquid cooled cold plate, heat spreader, heat pipe, or heat sink. The device 102 may take the form of, but is not limited to, an integrated circuit in various configurations such as a transformer or computer processor. The device 102 may be attached to a mounting 108, such as a printed circuit board. The device 102 may produce relatively constant or variable heat amounts according to thermal cycling, power-on/off cycling or changing demands on the device 102. The cooling plate 106 may include a small indentation to facilitate coupling between the device 102 and the cooling plate 106. Those skilled in the art will recognize that the example system 100 could take on a wide variety of useful forms depending on the elements and purpose of the system 100.

Figure 3:
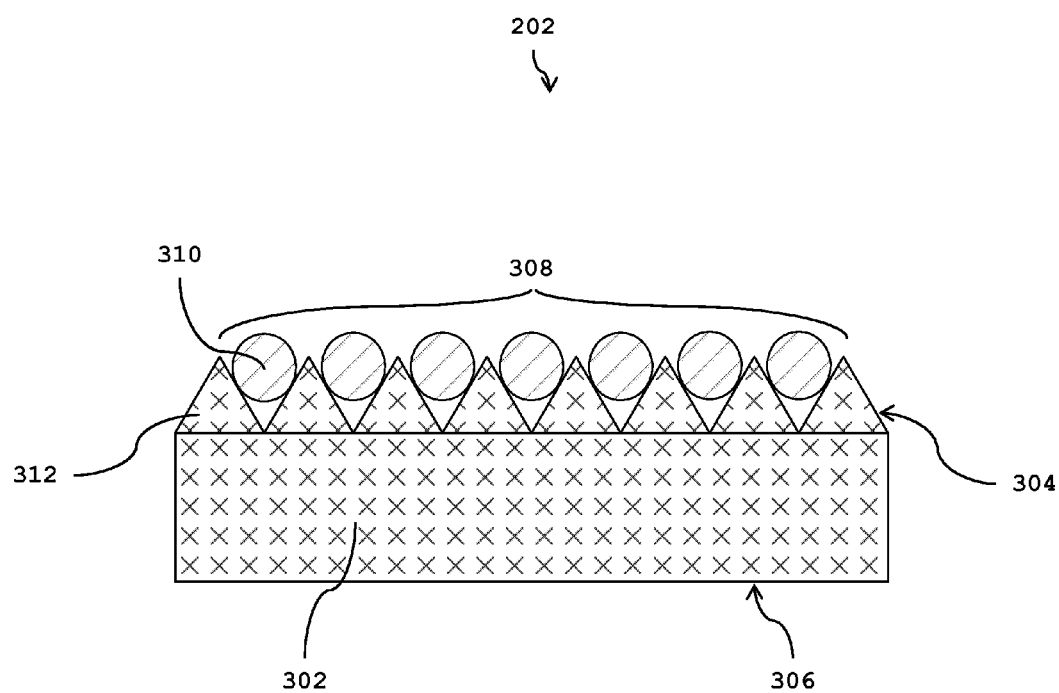
FIG. 3 shows an example thermal interface before it has been pressed between the device and cooling plate.

FIG. 3 shows an embodiment of the thermal interface 202 before it has been pressed between the device 102 and cooling plate 106. The thermal interface 202 includes a compressible solid pad 302. The solid pad includes a top surface 304 and a bottom surface 306. In the embodiment shown, the bottom surface 306 is substantially smooth. The top surface 304 includes a top surface treatment 308 carrying a flowable material 310. The thermal interface 202 may be arranged so that either the bottom surface 306 or the top surface 304 is in contact with either the device 102 or cooling plate 106.

The compressible solid pad 302 may include a thermal gap pad, such as Chomerics' G579 pre-cured thermal pad. Those skilled in the art will recognize that a variety of thermal interface materials with different compressibility, conductivity, and shape may achieve a similar result. The flowable material 310 may, for example, include a thermal grease, thermal gel, thermal paste, some combination of these, or any other relatively shapeable thermally conducting material. In a particular embodiment, the flowable material is pre-cured silicone gel, such as Chomerics XTS 8030.

The top surface treatment 308 of the top surface 304 may include a plurality of projections 312. In one embodiment, the projections 312 take the form of ridges, which may alternatively be described as grooves. Cutting away or skiving ridges and grooves of various depths into a compressible solid pad 302 forms the ridges in the present embodiment, but those skilled in the art will recognize a variety of methods can be used to achieve similar results. In the present embodiment, the ridges form a parallel pattern, but in other embodiments, the ridges may form crosshatched or other patterns to carry the flowable material 310.

Figure 4:
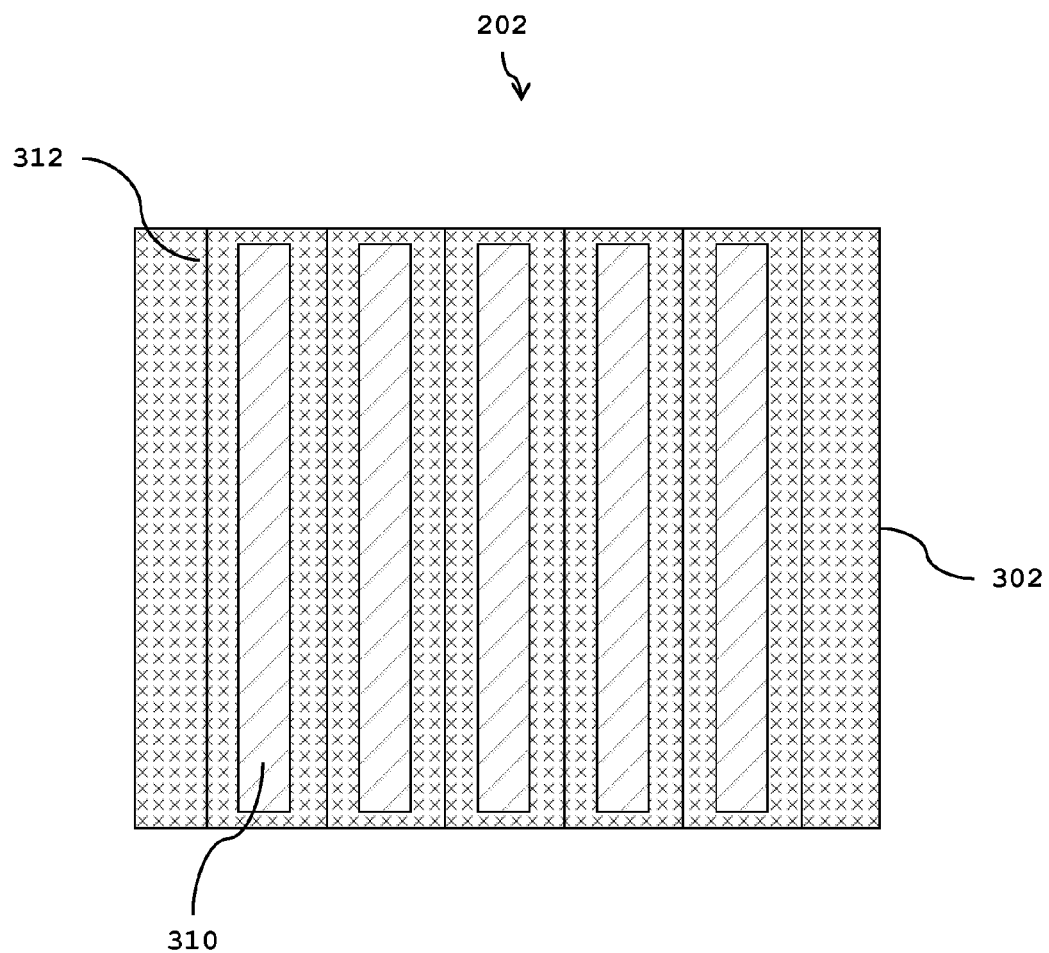
FIG. 4 shows a top-down view of an example thermal interface.

FIG. 4 shows a top-down view of the thermal interface 202 before it is pressed between the device 102 and cooling plate 106. The flowable material 310 is carried among the plurality of projections 312 and is almost completely enclosed by the compressible solid pad 302.

Figure 5:
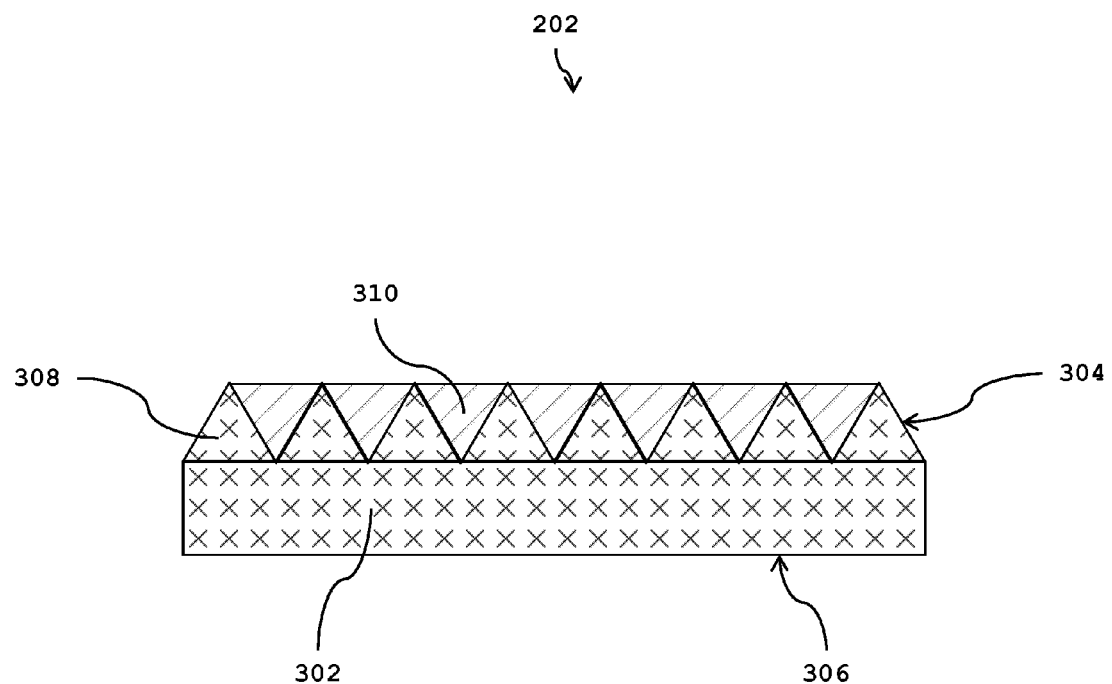
FIG. 5 shows a cross-sectional view of an example thermal interface after it has been pressed in place.

FIG. 5 shows a cross-sectional view of the thermal interface 202 after it has been pressed between the device 102 and cooling plate 106. The figure illustrates that the flowable material 310 conforms to the pattern of the projections 312. The compressible solid pad 302 also compresses to a smaller height (thickness) than before, and the flowable material 310 becomes completely enclosed.

Figure 6:
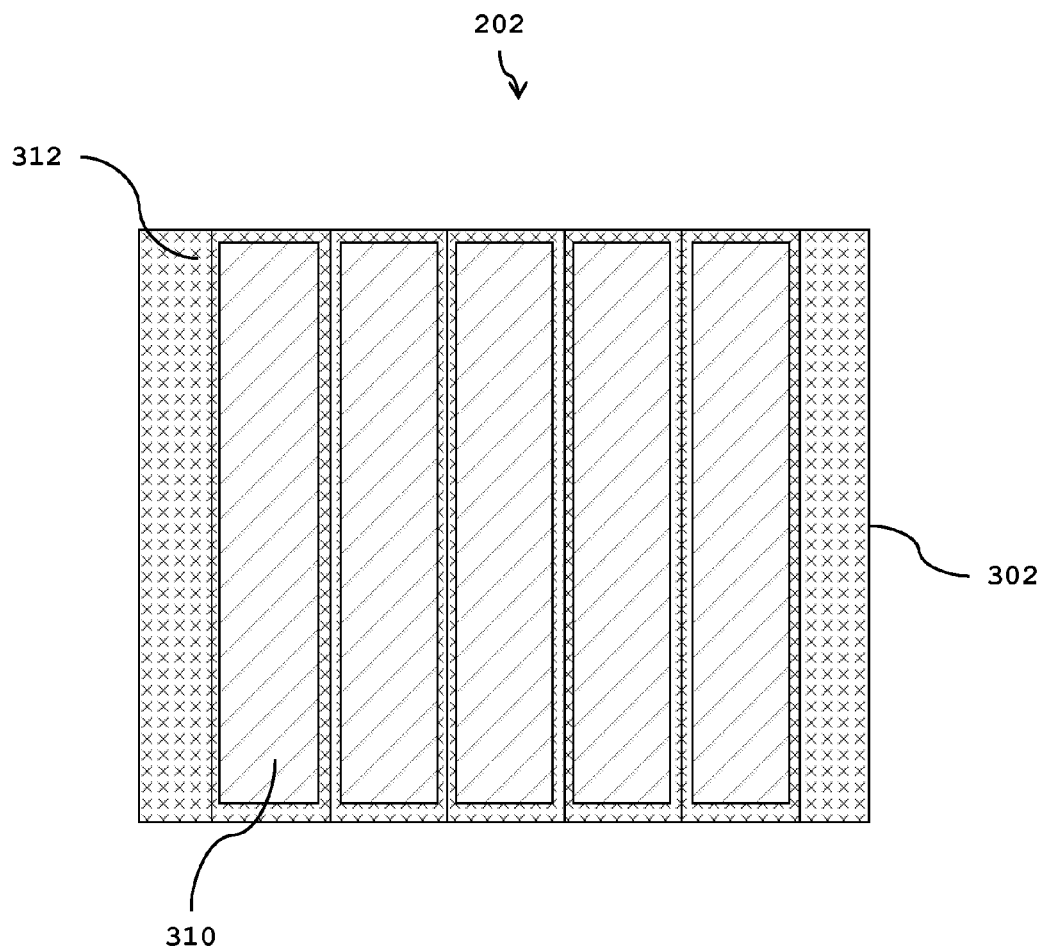
FIG. 6 shows a top-down view of an example thermal interface after it has been pressed in place.

FIG. 6 shows a top-down view of the thermal interface 202 after being pressed between the device 102 and the cooling plate 106. In comparison to FIG. 4, the flowable material 310 appears wider from the top-down view because it may spread out as it conforms to the pattern of the projections 312.

Figure 7:
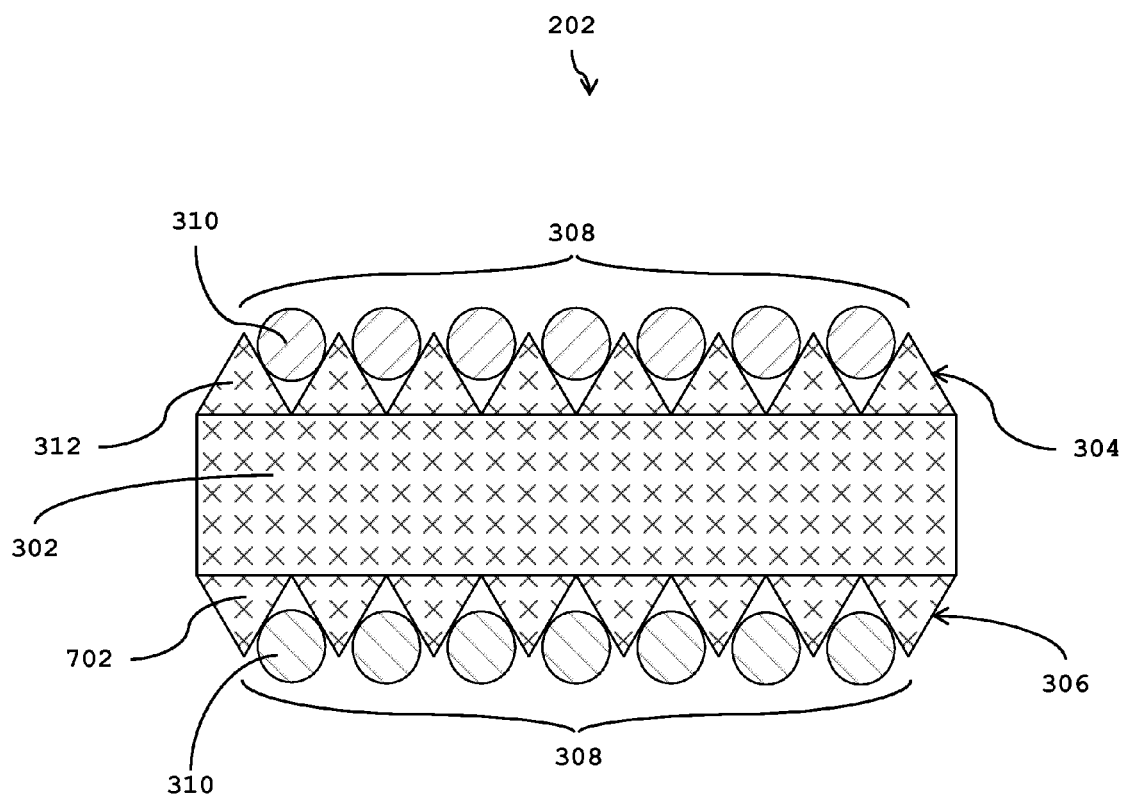
FIG. 7 shows a cross-sectional view of another example thermal interface before it has been pressed in place.
Figure 8:
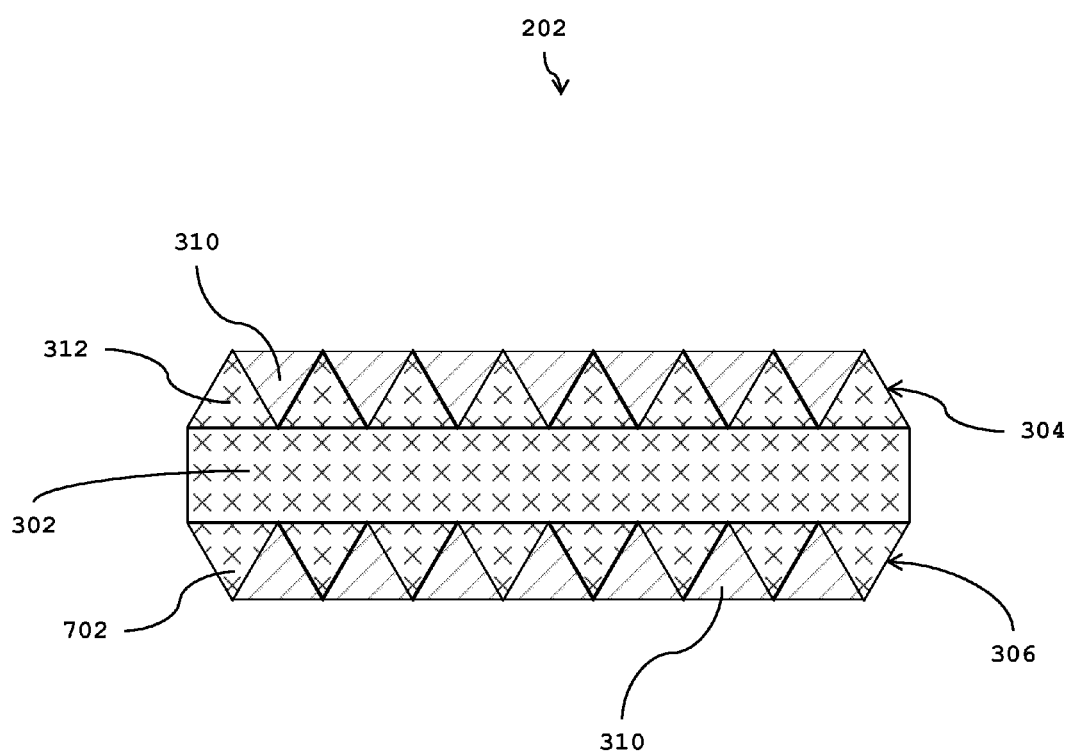
FIG. 8 shows a cross-sectional view of the example thermal interface of FIG. 7 after it has been pressed in place.

FIGS. 7 and 8 illustrate an alternate embodiment of the thermal interface 202. FIG. 7 shows a cross-sectional view of the thermal interface 202 before it has been pressed between the device 102 and cooling plate 106. The thermal interface 202 includes a compressible solid pad 302, which includes a top surface 304 and a bottom surface 306. The top surface 304 is exactly as described in the previous embodiment. Unlike the previous embodiment, the bottom surface 306 includes a bottom surface treatment 702 carrying the flowable material 310.

The bottom surface treatment 702, like the top surface treatment 308, also includes a plurality of projections 312, which in one embodiment take the form of a plurality of ridges. The general characteristics and embodiments of such projections 312 are described above. In this embodiment, the bottom surface treatment 702 may be similar to or different from the top surface treatment 308 in form and arrangement.

FIG. 8 shows a cross-sectional view of the thermal interface 202 of FIG. 7 after it has been pressed between the device 102 and cooling plate 106. As discussed above, the flowable material 310 conforms to the pattern of the projections 312 and 702. The compressible solid pad 302 also compresses to a smaller height (thickness) than before, and the flowable material 310 becomes completely enclosed.

Figure 9:
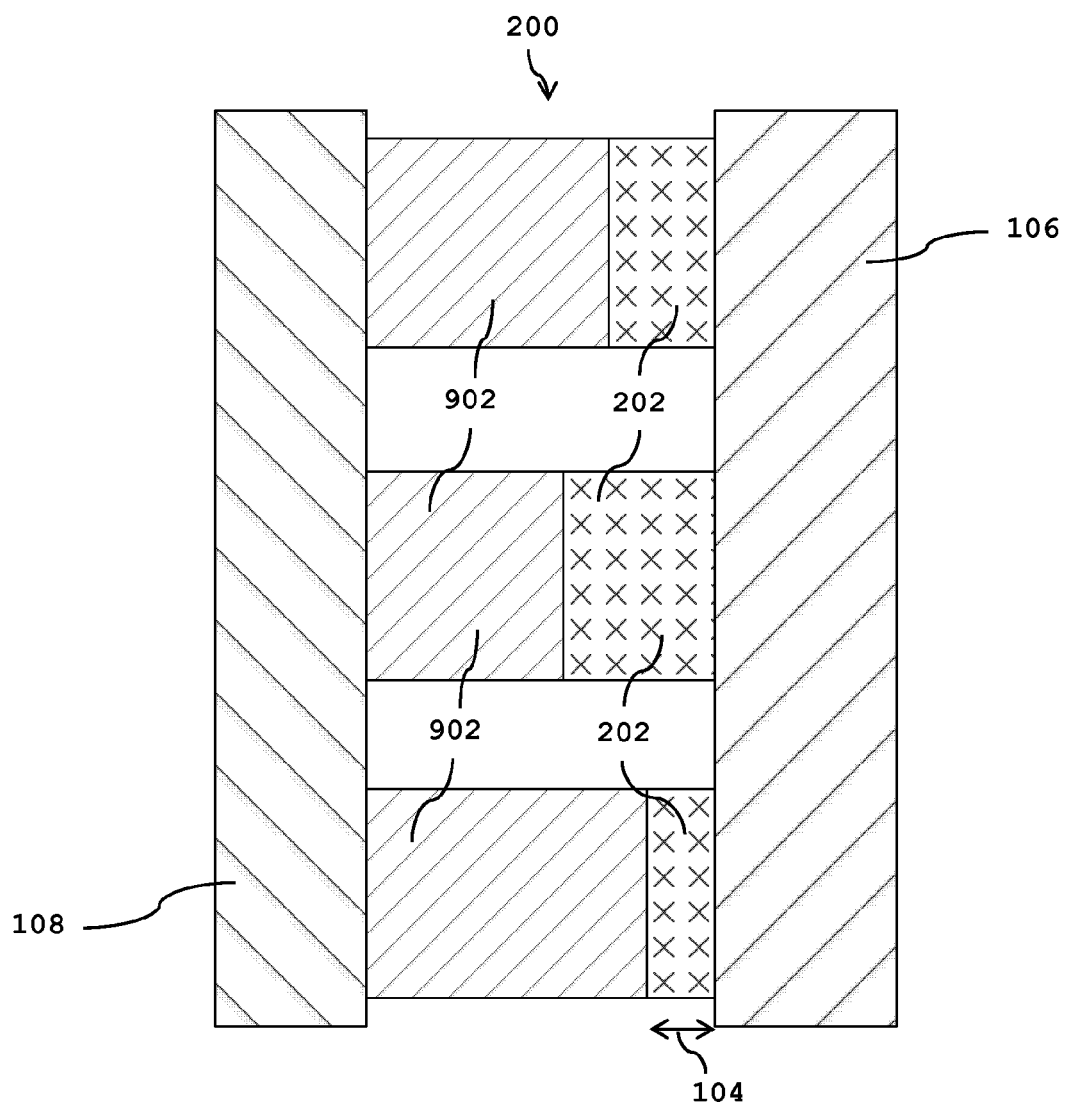
FIG. 9 shows a cross-sectional view of an example cooling system.

FIG. 9 shows an example cooling system 900 including a plurality of heat generating components 902 to be cooled. The cooling system 900 further includes a cooling plate 106, and a plurality of thermal interface units 202 pressed between each of the heat generating components 902 and the cooling plate 106. The heat generating components 902 are attached to a mounting 108, such as a printed circuit board. These heat generating components 902 take on a variety of embodiments, such as CPUs and transformers, as discussed above.

It should be understood that gaps 104 of variable thickness exist between each heat generating components 902 and the cooling plate 106 before the thermal interface units 202 are pressed between them. These gaps 104, sometimes known as thick gaps, generally span at least 0.25 mm, but may approach 5.0 mm and may include thin gaps (less than 0.25 mm) depending on the embodiment.

The gaps 104 are filled with thermal interface units 202, which may take a variety of forms and thicknesses (using a variety of thermal interface materials) depending on the gaps 104 and the nature of each heat generating device 902. A variety of embodiments of the thermal interface units 202 is described above. The cooling plate 106 is also described above.

Figure 10:
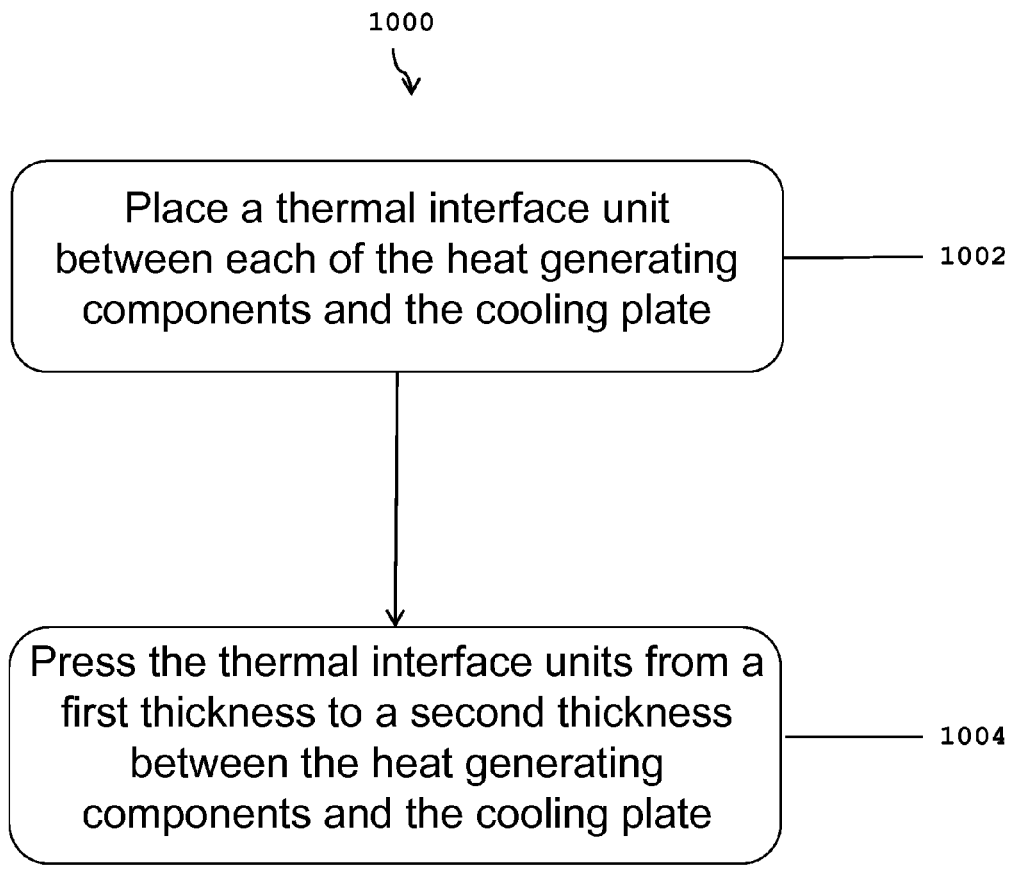
FIG. 10 shows an example method for coupling a plurality of heat generating components with a cooling plate.

FIG. 10 shows an example method for coupling 1000 a plurality of heat generating components 902 with a cooling plate 106, as contemplated by the present invention. The method includes a placing step 1002 to place a thermal interface unit 202 between each of the heat generating components 902 and the cooling plate 106. The thermal interface unit 202 includes a compressible solid pad 302 with at least one surface having a surface treatment 308 carrying a flowable material 310. The thermal interface unit 202, heat generating components 902, surface treatment 308, cooling plate 106 and several of their possible embodiments are described above.

A pressing step 1004 includes pressing the thermal interface units 202 between the heat generating components 902 and the cooling plate 106 so that the solid pad 302 is compressed from a first thickness to a second thickness. This step is done in a manner that any exposed flowable material 310 becomes completely contained by the thermal interface units 202 and the heat generating devices 902 or cooling plates 106 of which the thermal interface units 202 are pressed against.

Through this pressing step 1004, the thermal interface units 202 become attached to both the heat generating components 902 and the cooling plate 106 in a way that minimizes "pumping" (or dissociation) during the thermal cycles of the heat generating components 902.

The thermal interface units 202 may be prepared individually so that during the pressing step 1004, the mechanical force associated with pressing the embodiment together does not damage the heat generating components 902. Those skilled in the art will recognize that the duration of the pressing step 1004 can vary depending on the thermal interface materials used and the mechanical tolerances of the heat generating components 902.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. An apparatus for cooling a device with a gap between the device and a cooling plate, the apparatus comprising:
a thermal interface including a compressible solid pad, the solid pad including a top surface and a bottom surface, the top surface including projections defined by cutouts from the compressible solid pad, the projections carrying a flowable material.

2. The apparatus according to claim 1, wherein the plurality of projections have triangular cross-sections.

3. The apparatus according to claim 1, wherein the projections are pointed.

4. The apparatus according to claim 1, wherein the projections are crosshatched.

5. The apparatus according to claim 1, wherein the gap is at least 0.25 mm.

6. The apparatus according to claim 1, wherein the flowable material is at least one of a thermal gel, thermal paste, and thermal grease.

7. The apparatus according to claim 1, wherein the bottom surface is substantially smooth.

8. The apparatus according to claim 1, wherein the bottom surface includes a bottom surface treatment carrying the flowable material.

9. The apparatus according to claim 8, wherein the bottom surface treatment includes a plurality of projections.

10. The apparatus according to claim 8, wherein the bottom surface treatment includes a plurality of ridges.

11. The apparatus according to claim 8, wherein the bottom surface treatment is crosshatched.

12. A cooling system, comprising:
a plurality of heat generating components;
a cooling plate; and
a plurality of thermal interface units pressed between a respective one of the heat generating components and the cooling plate, each of the thermal interface units including a compressible solid pad, the solid pad including a top surface and a bottom surface, the top surface including projections defined by cutouts from the compressible solid pad, the projections carrying a flowable material.

13. The cooling system according to claim 12, wherein the heat generating components and the cooling plate are separated by gaps filled by the plurality of thermal interface units, the gaps being of variable thicknesses.

14. The cooling system according to claim 13, wherein thicknesses of the gaps are at least 0.25 mm.

15. The cooling system according to claim 12, wherein the plurality of projections have triangular cross-sections.

16. The cooling system according to claim 12, wherein the bottom surface includes a bottom surface treatment carrying the flowable material.

17. The cooling system according to claim 16, wherein the bottom surface treatment includes a plurality of projections defined by cutouts from the compressible solid pad, the projections carrying the flowable material.

18. The cooling system according to claim 12, wherein the flowable thermal material is at least one of a thermal gel, thermal paste, and thermal grease.

19. A method for coupling a plurality of heat generating components with a cooling plate, the method comprising:
placing a thermal interface unit between each of the heat generating components and the cooling plate, the thermal interface unit including a compressible solid pad, the solid pad including at least one surface having projections defined by cutouts from the compressible solid pad, the projections carrying a flowable material; and
pressing the thermal interface units between the heat generating components and the cooling plate.

20. The method according to claim 19, wherein pressing the thermal interface includes compressing the solid pad from a first thickness to a second thickness.

* * * * *